United States Patent [19]

Sato

[11] Patent Number: 5,142,148
[45] Date of Patent: Aug. 25, 1992

[54] FIELD EMISSION SCANNING ELECTRON MICROSCOPE AND METHOD OF CONTROLLING BEAM APERTURE ANGLE

[75] Inventor: Mitsugu Sato, Katsuta, Japan
[73] Assignee: Hitachi, Ltd., Tokyo, Japan
[21] Appl. No.: 500,494
[22] Filed: Mar. 28, 1990

[30] Foreign Application Priority Data

Mar. 30, 1989 [JP] Japan .................................. 1-079590

[51] Int. Cl.⁵ ............................................ H01J 37/28
[52] U.S. Cl. ...................................... 250/310; 250/307
[58] Field of Search ......................... 250/307, 310, 397

[56] References Cited

U.S. PATENT DOCUMENTS

| | | |
|---|---|---|
| 3,626,184 | 12/1971 | Saito . |
| 3,842,271 | 10/1974 | Gee ..................................... 250/310 |
| 3,927,321 | 12/1975 | Welter ................................. 250/311 |
| 4,547,669 | 10/1985 | Nakagawa et al. ................. 250/310 |
| 4,588,891 | 5/1986 | Saito ................................... 250/310 |
| 4,926,055 | 5/1990 | Miyokawa .......................... 250/307 |

FOREIGN PATENT DOCUMENTS

60-205952 10/1985 Japan .

OTHER PUBLICATIONS

"A High-Resolution Scanning Transmission Electron Microscope", Crewe et al., *Journ. of Applied Physics*, vol. 39, No. 13, Dec. 1968, pp. 586-568.

*Primary Examiner*—Bruce C. Anderson
*Attorney, Agent, or Firm*—Antonelli, Terry, Stout & Kraus

[57] ABSTRACT

A field emission scanning electron microscope in which an aperture plate is disposed in a high-vacuum region between an accelerating electrode and a condenser lens. Since a probe current can not be controlled by a lens system with the abovementioned structure, the probe current is controlled by controlling an extracting voltage applied to an extracting electrode. Deviation of the focal point taking place in accompanying a change of a virtual electron source position as brought about by the control of the probe current is corrected by controlling the focal length of a condenser lens such that the electron beam has a constant spread on the principal plane of an objective lens to thereby maintain a beam aperture angle ($\alpha_i$) at a specimen to be constant.

17 Claims, 5 Drawing Sheets

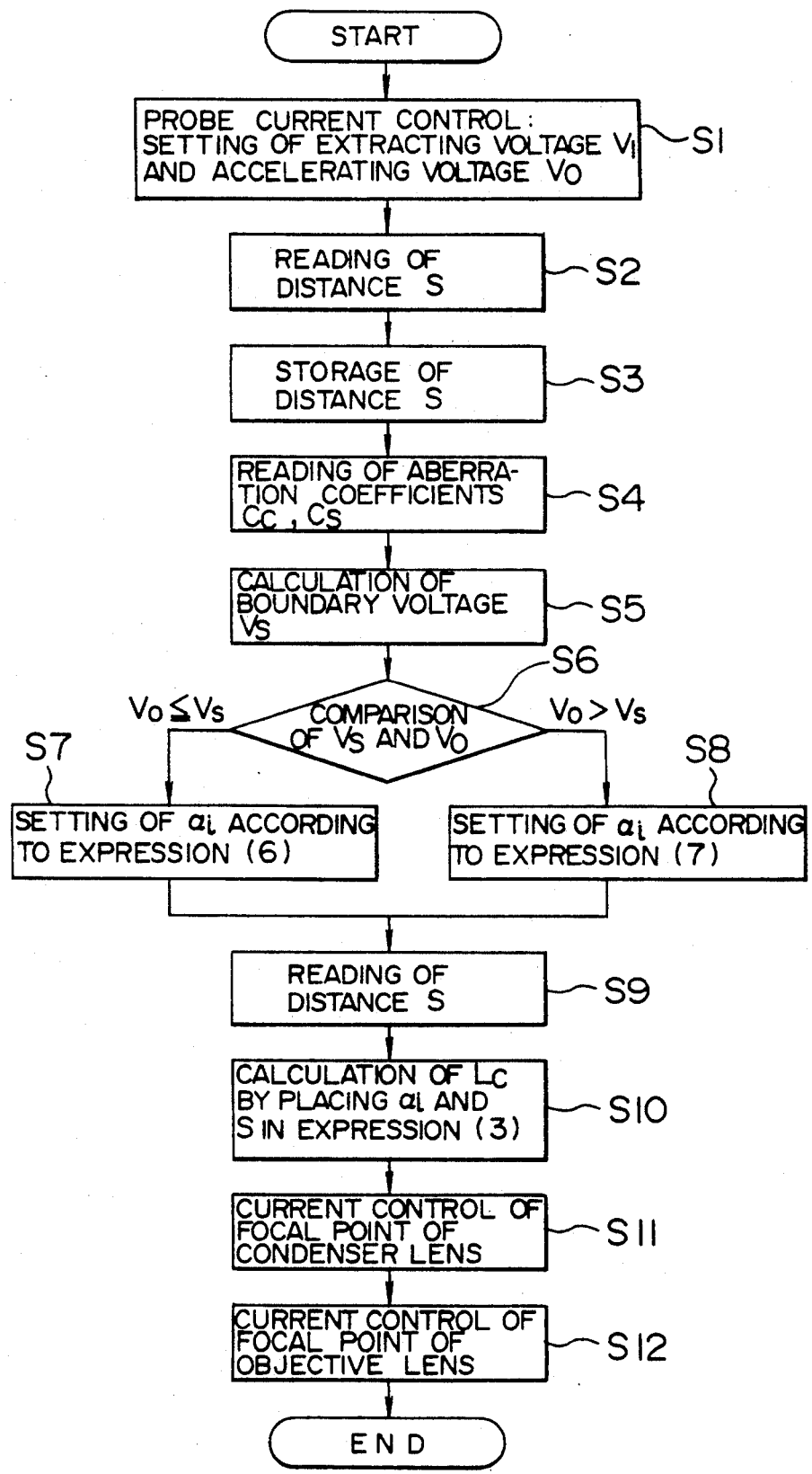

5,142,148

FIELD EMISSION SCANNING ELECTRON MICROSCOPE AND METHOD OF CONTROLLING BEAM APERTURE ANGLE

BACKGROUND OF THE INVENTION

The present invention relates generally to a scanning electron microscope incorporating a field emission type electron gun and more particularly to an electron microscope which is capable of protecting an aperture plate from contamination due to collision of an electron beam therewith and which can always assure a high resolving power or resolution. Further, the present invention is also concerned with a method of controlling the aperture angle of a beam in a field emission scanning electron microscope (hereinafter also referred to simply as FESEM in abbreviation).

In a scanning electron microscope, an aperture plate for determining the aperture angle of the electron beam (also referred to as the beam aperture angle) at a specimen is disposed on or in the vicinity of the principal plane of a condenser lens. This aperture plate is susceptible to contamination due to collision of the electron beam therewith during the use or operation of the electron microscope. Such contamination can be explained by the fact that the degree of vacuum prevailing at the location where the aperture plate is installed, i.e. the vacuum prevailing between the condenser lens and the objective lens, is ordinarily on the order of $10^{-4}$ Pa (pascal) and thus particles floating in the ambience of the aperture plate are caused to deposit on the aperture plate through illumination of the electron beam. As such contamination progresses, astigmatism becomes more significant, being accompanied by a deviation of the optical axis, as a result of which the resolving power or resolution is considerably degraded. Accordingly, when the contamination becomes aggravated, the aperture plate has to be removed from the column of the electron microscope for cleaning. As an alternative measure, an electric heating device may be previously installed in association with the aperture plate for heating it in the state placed under vacuum within the column by electrically energizing the heating device to thereby eliminate the contamination by sublimation. However, a great difficulty is encountered in installing the aperture plate equipped with such heating device in a narrow space in the vicinity of the condenser lens. Thus, the second mentioned method is not adopted in general.

As an approach for solving the problems mentioned above, there has already been proposed such an apparatus in which an electron gun exchangeable by means of a specimen holder is provided on a specimen supporting stage within a specimen changer for thereby allowing the aperture plate to be cleaned through illumination by the electron beam emitted from the abovementioned electron gun, as is disclosed in Japanese Utility Model Publication No. 29739/1976.

As will be seen, every one of the prior art methods of cleaning the aperture plate is concerned with a post-processing after the aperture plate is contaminated and suffers from the problem that a lot of time is required for the cleaning.

SUMMARY OF THE INVENTION

Accordingly, it is an object of the present invention to provide a field emission scanning electron microscope having a structure which allows the aperture plate to remain substantially insusceptible to contamination.

As mentioned hereinbefore, the contamination of the aperture plate (i.e. deposition of contaminants on the aperture plate) is a problem which arises when the aperture plate is illuminated by an electron beam in a poor vacuum environment. In other words, by increasing the degree or level of vacuum, contamination of the aperture plate through illumination with the electron beam becomes less likely to occur.

On the other hand, in view of the fact that the field emission electron gun can not operate stably unless the degree of ambient vacuum is in a range of $10^{-7}$ to $10^{-8}$ Pa, there is adopted a structure which can maintain a high vacuum particularly in the vicinity of the accelerating electrode.

Accordingly, in view of the above object, it is proposed according to the present invention to dispose or install the aperture plate below the accelerating electrode for which a high vacuum is maintained.

More specifically, there is provided according to a first aspect of the present invention a field emission scanning electron microscope (FESEM) including a field emission electron gun and an electron lens system for converging and focusing an electron beam emitted from the field emission electron gun, wherein an aperture plate is installed in a high vacuum region located between a final stage electrode of the field emission electron gun and the abovementioned lens system.

With this arrangement, the aperture plate is installed or disposed at a position where a high vacuum is maintained, whereby the aperture plate can be protected against contamination due to illumination by the electron beam.

It is another object of the present invention to provide a method of controlling an aperture angle of the electron beam in the field emission scattering electron microscope (FESEM) by controlling an aperture angle of a probe current with as small a number of parts as possible.

In the aforementioned structure of the FESEM according to the first aspect of the invention, the aperture plate for determining the diameter of the electron beam is no longer present within the lens system, as a result of which the probe current can not be controlled by the lens system. Thus, it is proposed according to a second aspect of the present invention to control the probe current by controlling an extracting voltage applied to an extracting electrode, while deviation or shift of a focal point accompanying a change in a virtual electron source position brought about by the probe current control is corrected by controlling the focal length of the condenser lens so that the spread of the electron beam on the principal plane of the objective lens remains constant, to thereby maintain the aperture angle $\alpha_1$ of the electron beam at a constant value. Since the beam aperture angle (which may also be referred to as the divergence angle of the beam when viewed from the side of the specimen) can thus be maintained constant regardless of changes in the accelerating voltage and the probe current, the electron optical system can be maintained constantly in the optimal state.

BRIEF DESCRIPTION OF THE DRAWINGS

FIG. 8 is a flow chart for illustrating a beam aperture angle control method according to an exemplary embodiment of the present invention.

DESCRIPTION OF THE PREFERRED EMBODIMENTS

Now, the invention will be described in detail in conjunction with preferred or exemplary embodiments by reference to the accompanying drawings.

Figure 1:
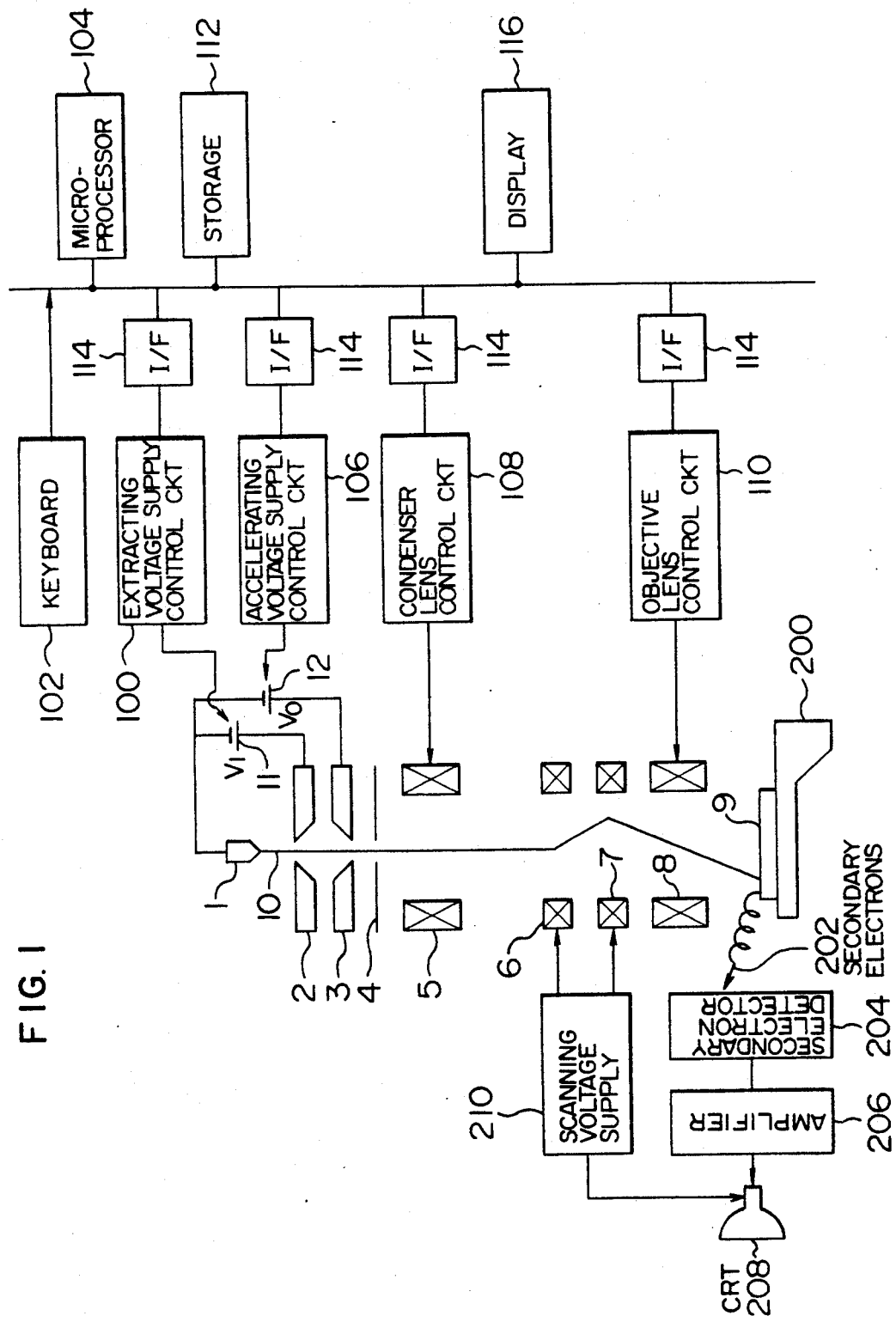
FIG. 1 is a view showing a general arrangement of a major ion of a field emission scanning electron microscope according to an exemplary embodiment of the invention.

FIG. 1 shows schematically a general arrangement of a major portion of a field emission scanning electron microscope according to an embodiment of the invention.

Referring to FIG. 1, a field emission electron gun which is a source for generating an electron beam is constituted by a cathode 1 formed of a single crystal of tungsten and finished by a chemical polishing, a first anode (extracting electrode) 2 for extracting the emission of electrons from the cathode 1 and a second anode (accelerating electrode) 3 for accelerating the electron beam.

There is applied across the cathode 1 and the extracting electrode 2 an emission extracting voltage $V_1$ (usually in a range of 3 kV to 6 kV) from a extracting voltage supply source 11, whereby the electron beam 10 is emitted from the cathode 1 through field emission.

A preferred value of the emission current 10 is determined in accordance with a specimen 9. When the emission current 10 as determined is set by the operator with the aid of a keyboard 102, a microprocessor 104 controls an extracting voltage supply control circuit so that the extracting voltage $V_1$ has a value corresponding to the emission current as set.

Applied between the cathode 1 and the accelerating electrode 3 is an accelerating voltage $V_0$ (usually in a range of 500 to 30 kV) from an accelerating voltage supply source 12, whereby the electron beam 10 is accelerated. There exists also a preferred accelerating voltage for the the specimen 9 under exploration. When the preferred accelerating voltage is set by the operator through the keyboard 102, the microprocessor 104 controls an accelerating voltage supply control circuit 106 so that the accelerating voltage assumes the voltage value as set.

Disposed below the field emission electron gun are a group of electron lenses including a condenser lens 5, deflectors 6 and 7 and an objective lens 8.

Figure 2:
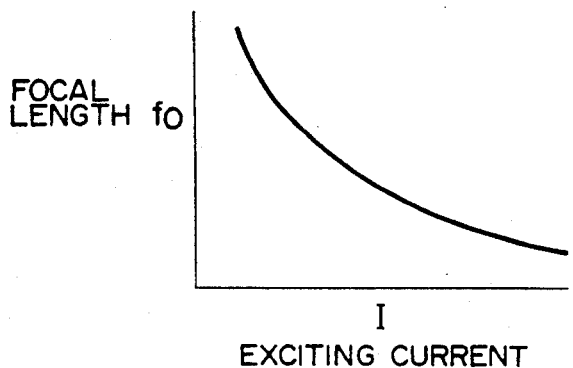
FIG. 2 is a view for illustrating graphically a relation between a focal length $f_o$ and an exciting current I in an electron lens.

The condenser lens 5 and the objective lens 8 are each of a known structure. The focal length $f_o$ of the lens bears generally a relation to a control current I applied to the lens such as illustrated in FIG. 2. This relation can be definitely determined in dependence on the number of turns of the lens coil and other factors. Consequently, the focal lengths of the electron lenses 5 and 8 change in dependence on the magnitude of the currents applied through respective control circuits 108 and 110. The objective lens 8 is capable of determining definitely the beam aperture angle in correspondence with the spread of the electron beam on the principal plane of the lens 8.

The individual control circuits 100, 102, 104 and 106 are connected to the microprocessor 104 through respective interfaces 114.

The X-axis deflector 6 as well as the Y-axis deflector 7 are each of a known structure and serve to scan the specimen 9 with the electron beam in accordance with the signal inputted from a predetermined scanning voltage supply source 210. A signal which is in synchronism with the abovementioned signal is also inputted to a display (CRT) 208 from the scanning voltage supply source 210.

The deflectors 6 and 7, the objective lens 8, the specimen 9 and a predetermined stage 200 for supporting the specimen 9 thereon are mounted in a predetermined manner within a first housing of a cylindrical configuration, while the condenser lens 5, the two electrodes 2 and 3 and the cathode 1 are individually mounted within respective housings disposed sequentially on and above the first housing. Formed in a partition wall between the first housing and that for the condenser lens 5 is a fine or thin through-hole (having a diameter in a range of 0.5 to 1.0 mm) for allowing the electron beam to pass therethrough. Similar beam passage holes are formed in a partition wall between the housing for the condenser lens 5 and that for the electrodes 2 and 3 as well as in a partition wall between the housing for the electrodes 2 and 3 and that for the cathode 1, respectively. Connected to the first housing in a predetermined manner is an oil diffusion pump or a turbo molecular pump, whereby the interior of the first housing is maintained at a vacuum of about $10^{-4}$ Pa (pascal). Each of the housings installed above the first housing as described above is connected to an ion pump in a predetermined manner, whereby these housings are maintained at vacuums increasing sequentially. By way of example, the interior of the housing for the condenser lens 5 is maintained at a vacuum of $10^{-5}$ Pa, the interior of the housing for the electrodes 2 and 3 is maintained at $10^{-6}$ Pa, and that of the housing for the cathode 1 is maintained at $10^{-7}$ Pa.

With the column structure described above, the aperture plate 4 for determining the beam diameter of the electron beam 10 to a desired value is disposed above the condenser lens 5 and mounted within the housing for the condenser lens in a predetermined manner. The aperture plate 4 is formed with a plurality of fine holes extending through the plate 4 in the direction in which the electron beam is to pass therethrough. The aperture plate 4 is connected to a conventional position adjusting mechanism known in the art for moving horizontally the aperture plate 4 in the X-, Y-directions so that the aperture or through-hole having a desired diameter can be selected in accordance with the probe current and other factors as required for the specimen while allowing the aperture or the hole to be aligned with the electron beam 10.

With the column structure described above, the electron beam 10 extracted from the field emission tip 1 by the first anode 2 is accelerated by the second anode 3 to be subsequently constricted to a predetermined beam diameter by the aperture plate 4 and incident onto the condenser lens 5. The electron beam 10 now having the beam diameter constricted is converged through the condenser lens 5 and focused through the objective lens 8 to impinge on the surface of the specimen 9. The X-deflector 6 and the Y-deflector 7 disposed between the condenser lens 5 and the objective lens 8 serve to scan the surface of the specimen 9 with the focused electron beam.

The secondary electrons 202 emitted from the specimen 9 are detected by a predetermined secondary electron collector 204, the output signal of which is amplified by an amplifier 206, whereby an image obtained by the scanning is displayed on the CRT 208. However, it goes without saying that the signal to be detected is never limited to that of secondary electrons.

In field emission scanning electron microscope the structure described above, the aperture plate 4 can satisfactorily be protected against contamination due to illumination of the electron beam because the aperture plate 4 is placed under a high vacuum.

It is however noted that when the aperture plate 4 is installed between the accelerating electrode 3 and the condenser lens 5, it becomes impossible to control the probe current by the lenses. Accordingly, in the case of the illustrated embodiment, the control of the beam current of the electron beam emitted from the cathode 1 is performed by controlling the extracting voltage $V_1$.

In the case of the field emission electron gun, the beam current can be varied over a wide range in dependence on the extracting voltage $V_1$. Accordingly, by controlling the extracting voltage $V_1$, it is possible to control the probe current over a range equivalent to or wider than that available in the structure in which the aperture plate 4 is disposed below the condenser lens 5.

However, when a field emission electron gun is employed as the electron beam emission source, the extracting electrode 2 and the accelerating 3 function as electrostatic lenses. As a consequence, when the probe current is changed by controlling the extracting voltage $V_1$ or the accelerating voltage $V_2$ in consideration of damage of the specimen, the virtual electron source position as viewed from the side of lens systems of the succeeding stages will be changed.

Figure 3:
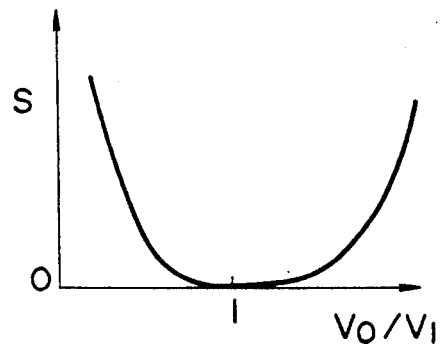
FIG. 3 is a view for illustrating graphically a relation between a ratio of an accelerating voltage/extracting voltage ($V_0/V_1$) and a distance S from a cathode to a virtual electron source position.

FIG. 3 is a view illustrating graphically a relation existing between the ratio of the extracting voltage $V_1$ to the accelerating voltage $V_0$ (i.e. $V_0/V_1$) and a distance S from the cathode 1 to the virtual electron source position. As can be seen in this figure, the virtual electron source position is displaced as a function of the ratio of $V_0/V_1$.

Figure 4:
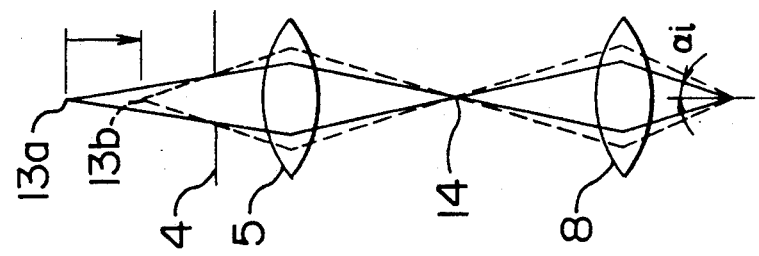
FIG. 4 is a schematic diagram for illustrating for comparison a beam aperture or divergence angle control method adopted at an examination stage in the course of development of the electron microscope according to the present invention for comparison.

It is further noted that displacement of the virtual electron source position brings about a shift or deviation of the focal point of the beam on the specimen. Accordingly, a focusing or focal-point realigning operation has to be performed. In this conjunction, at a stage for examination in the course of development of the electron microscope according to the invention, the focusing operation was performed by controlling the condenser lens current such that the position of the focal point 14 of the condenser lens 5 remains stationary when the virtual electron source moved from a position 13a to a position 13b, as shown in FIG. 4. Reference may be made to Japanese Patent Application No. 59223/1988.

However, with the control mentioned above, the spread of the electron beam on the principal plane of the objective lens then undergoes a change, as a result of which the optimal beam divergence angle $\alpha_i$ set previously can no longer be maintained, giving rise to another problem that a higher resolution can not be realized.

Figure 5:
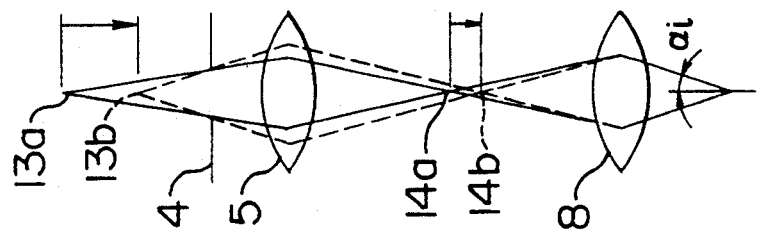
FIG. 5 is a schematic diagram for illustrating the concept underlying the beam aperture or divergence angle control method according to the present invention.

Under the circumstance, it is taught by the present invention that when the virtual electron source has been displaced from a position 13a to a position 13b, as shown in FIG. 5, the focal point of the condenser lens 5 is moved from a position 14a to a position 14b through a procedure described in more detail hereinafter so that the spread of the electron beam on the principal plane of the objective lens remains constant, to thereby maintain the beam aperture angle $\alpha_i$ constant.

Now, description will be turned to a relation between the virtual electron source position and the optimal beam aperture or divergence angle $\alpha_i$.

Figure 6:
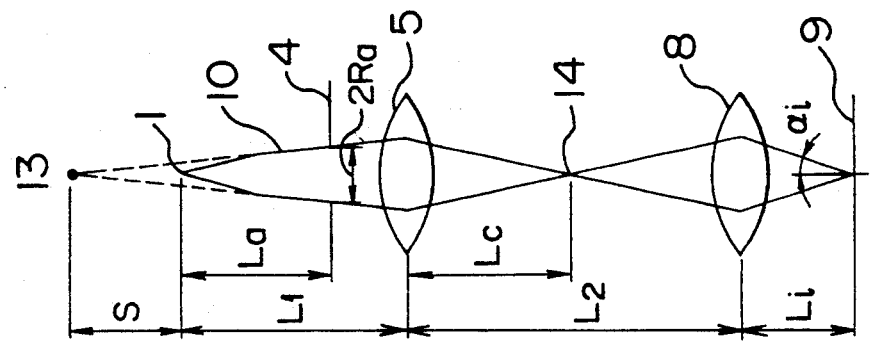
FIG. 6 is a schematic diagram for illustrating a relation between the virtual electron source position and an optimum beam aperture angle.

Referring to FIG. 6, let's represent the distance between a virtual electron source 13 and the cathode 1 by S, the distance between the cathode 1 and the aperture plate 4 by $L_a$, the distance between the cathode 1 and the principal plane of the condenser lens 5 by $L_1$, the distance between the principal plane of the condenser lens 5 and that of the objective lens 8 by $L_2$, the distance between the principal plane of the objective lens 8 and the specimen surface by $L_i$, the distance between the principal plane of the condenser lens 5 and the position 14 to which the beam is focused by the condenser lens 5 by $L_c$, and the radius of the aperture or hole formed in the aperture plate 4 by $R_a$. Then, the beam divergence angle $\alpha_i$ on the specimen 9 is given by the following expression (2):

$$\alpha_i = \{R_a/(S+L_a)\} \times \{(S+L_1)/L_c\} \times \{(L_2-L_c)/L_i\}(\text{rad}) \quad (2)$$

Accordingly, for the change of the virtual electron source position S, the position $L_c$ to which the beam is focused by the condenser lens 5 can be given by the following expression (3):

$$L_c = \{L_2(S+L_1)R_a\}/\{L_i(S+L_a)\alpha_i + (S+L_1)R_a\} \quad (3)$$

Since the expression (2) contains as parameters an arbitrary virtual electron source position S and an arbitrary beam aperture angle $\alpha_i$, the virtual electron source position S is determined on the basis of the relation described hereinbefore by reference to FIG. 3 with the optimal beam aperture angle $\alpha_i$ being determined through a procedure described later on. By placing the values of S and $\alpha_i$ thus determined in the above expression (3), the position or distance $L_c$ is determined through calculation, whereby realignment of the focal point of the condenser lens 5 can be performed without involving change in the beam aperture angle $\alpha_i$.

When the focal point on the specimen is shifted as the result of a realignment of the focal point of the condenser lens 5, realignment of the focal point on the specimen is then performed by controlling the objective lens 8.

According to the adjusting method described above, the optimal beam aperture angle $\alpha_i$ once established can be maintained even when the virtual electron source position is shifted due to the change of the extracting voltage $V_1$ for controlling the probe current.

It must be mentioned that the beam aperture angle $\alpha_i$ at which the diameter of the electron beam illuminating the specimen is reduced to a minimum and the highest resolving power can be attained will differ in dependence on regions of acceleration of the electron beam.

In the following, description will be made as to how the optimal beam aperture or divergence angle $\alpha_i$ differs in dependence on different regions of acceleration by taking into account the acceleration voltage $V_0$ (V), chromatic aberration coefficient $C_c$ (mm) and spherical aberration coefficient $C_s$ (mm) of the objective lens, width or energy $\Delta V$ (eV) of the electron beam and the de Broglie Wavelength $\lambda$ (mm) of an electron.

In a low acceleration region where the chromatic aberration is dominant, the thinnest electron probe can be realized when the spread $\delta_d$ of the electron beam due to diffraction is in balance with the spread $\delta_c$ of the electron beam due to the chromatic aberration.

The spread $\delta_d$ of the electron beam due to diffraction is given by the following expression (4), as is well known in the art. Reference may be made to K. Ura: "Denshi Kogaku (Electronics Engineering)", Kyoritsu Zensho (1979), p. 59.

$$\delta_d = 1.22 \times \lambda/\alpha_i \qquad (4)$$

Further, the spread $\delta_c$ of the electron beam due to the chromatic aberration is given by the following expression (5), as is known in the art (refer to "Denshi Kogaku" cited above, page 73):

$$\delta_c = C_c \cdot (\Delta V/V_0) \cdot \alpha_i \qquad (5)$$

Since the beam divergence angle $\alpha_i$ which satisfies the condition that $\delta_d = \delta_c$ is the beam aperture angle in the low acceleration region, $$1.22 \times \lambda/\alpha_i = C_c \cdot (\Delta V/V_0) \times \alpha_i$$

Thus, the optimal beam aperture angle $\alpha_i$ in the low acceleration region can be given by the following expression (6):

$$\alpha_i = 1.1 \times \{(\lambda/C_c) \times (V_0/\Delta V)\}^{\frac{1}{2}} \qquad (6)$$

On the other hand, the optimal beam aperture angle $\alpha_i$ in the high acceleration region where the spherical aberration is dominant is given by the following expression (7), as is well known in the art. In this conjunction, reference may be made to A.V. Crewe: High-Resolution Scanning Transmission Electron Microscopy, SCI. Vol. 221 (1983), p. 326.

$$\alpha_i = (4\lambda/C_s)^{\frac{1}{4}} \qquad (7)$$

Parenthetically, the boundary between the low acceleration region and the high acceleration region is determined by the acceleration at which the beam aperture angles $\alpha_i$ in these regions coincide with each other.

More specifically, if the de Broglie wavelength $\lambda$ is given by $$\lambda = (150/V_0)^{\frac{1}{2}} \cdot 10^{-7} \text{ (mm)}$$

then $$1.1 \times \{(\lambda/C_c) \times (V_0/\Delta V)\}^{\frac{1}{2}} = (4\lambda/C_s)^{\frac{1}{4}}$$

Thus, the acceleration voltage $V_s$ at the boundary is given by the following expression (8):

$$V_s = 1.71 \times 10^4 \times C_s^{-\frac{2}{3}} \times C_c^{4/3} \times \Delta V^{4/3} (V) \qquad (8)$$

In this manner, by setting the beam aperture angle $\alpha_i$ in accordance with the aforementioned expression (6) in the low acceleration region where $V_0 \leq V_s$ while setting the beam aperture angle $\alpha_i$ on the basis of the aforementioned expression (7) in the high acceleration region where $V_0 > V_s$, there can always be maintained the conditions for realizing the highest resolving power.

Incidentally, the aberration coefficients of the electron optical system changes in dependence on the distance $L_i$ between the principal plane of the objective lens 8 and the specimen 9. Accordingly, by determining the distance $L_i$ from the exciting current of the objective lens, it is possible to determine the aberration coefficients at the specimen position of concern.

Thus, by storing previously the relations between the exciting current of the objective lens and the aberration coefficients $C_c$ and $C_s$ in appropriate storage means, determination of these aberration coefficients $C_c$ and $C_s$ can be much facilitated.

Figure 7:
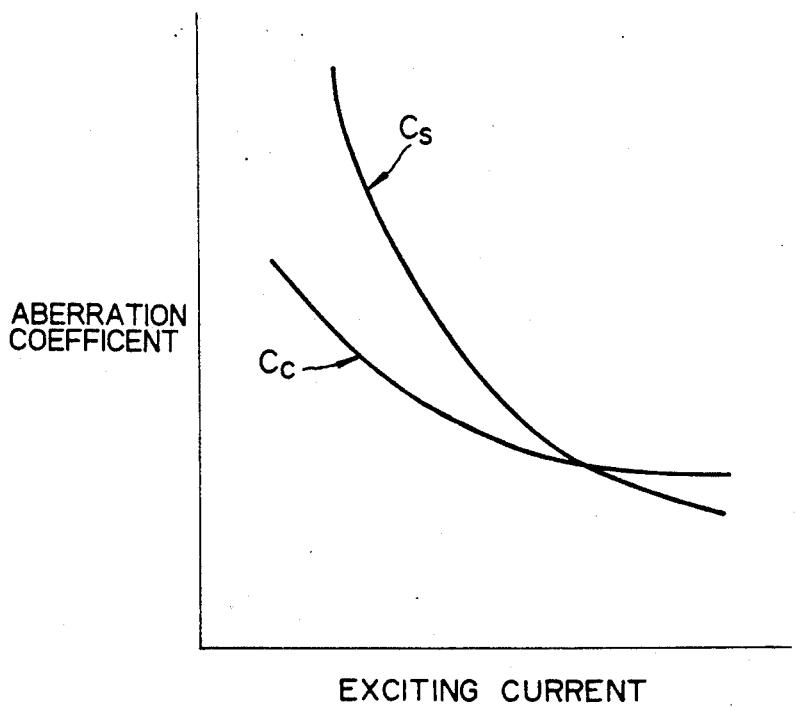
FIG. 7 is a view for illustrating graphically relations existing between aberration coefficients ($C_c$, $C_s$) and the exciting current of an objective lens.

Typical relations between the exciting current and the aberration coefficients are graphically illustrated in FIG. 7.

In the following, a method of maintaining the beam aperture angle $\alpha_i$ constant by performing alignment of the focal point of the condenser lens 5 in accordance with the expressions (2) to (7) will be described by reference to a flow chart shown in FIG. 8.

In conjunction with the I-$f_o$ characteristics (FIG. 2) of the condenser lens 5 and the objective lens 8, the relation between $L_c$ and the exciting current I of the condenser lens 5 as well as the relation between $L_i$ and the exciting current of the objective lens 8 are determined in accordance with respective lens formulae:

$$\frac{1}{L_c} + \frac{1}{L_1 + S} = \frac{1}{f_o}, \quad \frac{1}{L_i} + \frac{1}{L_2 - L_c} = \frac{1}{f_o}$$

and stored in the storage or memory 112 in the form of tables (or approximate functional expressions). In order to make the beam aperture angle $\alpha_i$ constant independent of change or shift or the focal point 14, it is necessary to vary the focal distance $f_o$ of the objective lens 8. In general, the exciting current of the condenser lens 5 (or distance of $L_c$-$L_2$) is detected and controlled to this end.

Similarly, the I-$C_c$-$C_s$ characteristics of the objective lens 8 illustrated in FIG. 7 are stored in the storage 112 at a predetermined address. Further, the relations between the ratio $V_0/V_1$ and the virtual electron source position S illustrated in FIG. 3 are stored in the storage 112 at a predetermined address. Besides, a predetermined control program for performing the control described below is also stored in the storage 112.

Now referring to FIG. 8, at a step S1, the accelerating voltage $V_0$ is set in accordance with the specimen under exploration as well as the content of the exploration, while the optimum probe current is set in accordance with the specimen under exploration as well as the content thereof by controlling the emission current through control of the extracting voltage $V_1$.

At a step S2, the microprocessor 104 reads out the extracting voltage $V_1$ and the accelerating voltage $V_0$ from the extracting voltage supply control circuit 100 and the accelerating voltage supply control circuit 106 to arithmetically determine the ratio of $V_0/V_1$, the result of which is compared with the information about the $S$-$V_0/V_1$ relation illustrated in FIG. 3 and stored in the storage 112 to read out the virtual electron source position S.

At a step S3, the information about the virtual electron source position S obtained at the step S2 is written in the storage means 112 at a predetermined address.

At a step S4, the microprocessor 104 reads the exciting current of the objective lens from the objective lens control circuit 110, the result of which is compared with the information about the relations illustrated in FIG. 7 and stored previously in the storage 112 to determine the aberration coefficients $C_c$ and $C_s$.

At a step S5, the values of the aberration coefficients $C_c$ and $C_s$ obtained at the step S4 are placed in the expression (8) to arithmetically determine the boundary acceleration voltage $V_S$ mentioned hereinbefore. The information of these aberration coefficients $C_c$ are saved in a register incorporated in the microprocessor.

At a step S6, the boundary accelerating voltage $V_S$ is compared with the accelerating voltage $V_0$ read out from the accelerating voltage supply control circuit 106. When $V_0 \leq V_S$, the processing proceeds to a step S7 and otherwise (i.e. if $V_0/V_S$) to a step 8.

At the step S7, the chromatic aberration coefficient $C_c$ is placed in the expression (6) to arithmetically determine the beam aperture angle $\alpha_i$, which is then saved in a register incorporated in the microprocessor 100.

At the step S8, the spherical aberration coefficient $C_s$ is placed in the expression (7) to arithmetically determine the beam aperture angle $\alpha_i$, the result of which is saved in a register incorporated in the microprocessor 104.

At a step S9, the information about the virtual electron source position S is read out from the storage 112.

At a step S10, the beam aperture angle $\alpha_i$ obtained at the steps S7 or S8 and the virtual electron source position S read out at the step S9 are placed in the expression (3) to thereby determine arithmetically the value of the distance $L_c$ of the focal point of the condenser lens 5.

At a step S11, the exciting current of the condenser lens 5 is controlled through the condenser lens control circuit 108 on the basis of the relation illustrated in FIG. 2A and stored in the storage 112 so that the focal length $L_c$ of the condenser lens 5 assumes the value determined at the step S10. This control is performed on the basis of the I—$L_c$ characteristic information previously stored in the storage 112. Thus, the electron beam is always incident on the objective lens 8 with a constant spread at the principal plane thereof.

The incident angle of the electron beam relative to the principal plane of the objective lens 8 varies in dependence on the focal length $L_c$, even when the spread of the electron beam on the principal plane of the objective lens 8 is constant. Accordingly, at a step S12, the focal length $f_o$ of the objective lens 8 is controlled on the basis of the exciting current of the condenser lens 5 to maintain constant the distance $L_i$ defined hereinbefore and hence the beam aperture angle $\alpha_i$.

According to the focal point aligning or adjusting method described above, the probe current can be controlled without involving deviation of the beam aperture angle from the initially set value and without need for the addition of other parts such as an additional condenser lens and the line.

Figure 9:
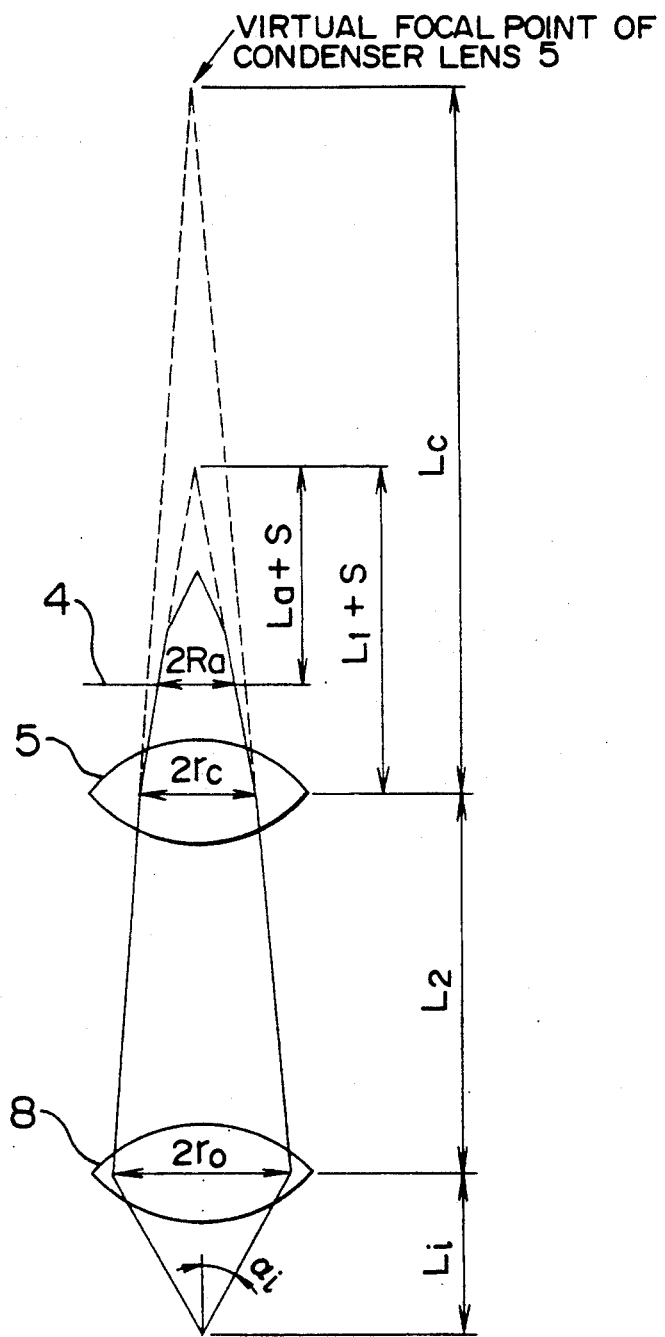
FIG. 9 is a view for illustrating a relation existing between the virtual electron source position and the optimal beam aperture angle.

FIG. 9 is a view for illustrating a method of controlling the beam aperture angle according to another embodiment of the present invention. Parenthetically, FIG. 9 is depicted to have correspondence with FIG. 6, wherein the same or equivalent elements are denoted by like reference symbols in both figures.

As can be seen from comparison of both figures, the method illustrated in FIG. 9 is characterized in that no crossover point is produced between the condenser lens 5 and the objective lens 8. By virtue of this feature, the refractive index required for the objective lens 8 can be made smaller. This type of optical system is generally known, as is disclosed in JP-A-53-78164.

In the optical system of this type, the method for maintaining constant the beam aperture angle $\alpha_i$ is carried out in the manner described below.

The relation between the distance $L_c$ to the virtual focal point of the condenser lens 5 and the beam aperture angle $\alpha_i$ can be derived, as follows. From the geometry of the optical system shown in FIG. 9, the following relation applies:

$$R_a : r_c = (L_a + S) : (L_1 + S) \tag{11}$$

$$\therefore r_c = \frac{L_1 + S}{L_a + S} R_a$$

Similarly, $$r_c : r_0 = (L_c + S) : (L_c + S_2) \tag{12}$$

$$\therefore r_0 = \frac{L_c + L_2}{L_c} r_c$$

On the other hand, the beam aperture angle $\alpha_i$ is given by $$\alpha_i = \frac{r_0}{L_i} \text{ (rad)} \tag{13}$$

From the relations (11) and (12), the expression (13) can be rewritten as follows:

$$\alpha_i = \frac{1}{L_i} \cdot \frac{L_c + L_2}{L_c} \cdot \frac{L_1 + S}{L_a + S} R_a \tag{14}$$

Accordingly, for the desired beam aperture angle $\alpha_i$, the following relation applies:

$$L_c = \frac{R_a(L_1 + S)L_2}{L_i(L_a + S)\alpha_i - R_a(L_1 + S)} \tag{15}$$

However since only the value in the range of $(L_1 + S)$ to infinity can be set for the distance $L_c$, the control in accordance with the expression (15) can be applied within the range of values of $\alpha_i$ given below:

$$\frac{R_a}{L_i} \cdot \frac{L_1 + S}{L_a + S} \leq \alpha_i \leq \frac{R_a}{L_i} \cdot \frac{L_1 + L_2 + S}{L_a + S} \tag{16}$$

In carrying out the control method for the optical system shown in FIG. 9, the expression (15) is used in place of the expression (3) at the step S10 in the method comprising the steps S1 to S12 described hereinbefore in conjunction with the preceding embodiment (FIG. 8).

The distance $L_c$ determined arithmetically at the step S10 in the case of the instant embodiment can be realized as follows. Since the focal length $f_c$ of the condenser lens 5 is given from the lens formula:

$$\frac{1}{L_1 + S} - \frac{1}{L_c} = \frac{1}{f_c} \qquad (17)$$

$$f_c = \frac{L_c(L_1 + S)}{L_c - (L_1 + S)} \qquad (18)$$

it is possible to determine the current set for the condenser lens 5 from the focal length $f_c$ calculated in accordance with the expression (18) with the aid of a $f_c$-$I_{cond}$ characteristic table (or functional expression) stored previously, where $I_{cond}$ represents the current of the condenser lens. When $L_c = L_1 + S$, then $f_c$ becomes infinite, which means that the condenser lens current $I_{cond}$ is equal to zero.

It is to be mentioned that when a specimen surface has appreciable roughness, there may arise a situation in which the focal depth becomes excessively shallow at the beam aperture angle $\alpha_i$ at which the highest resolution can be obtained. In such case, it is important to increase the focal depth by making the beam aperture angle $\alpha_i$ smaller than the value which can assure the greatest resolution.

Accordingly, in case a specimen for exploration has an appreciably rough surface, the beam aperture angle $\alpha_i$ is set appropriately by taking into account the focal depth, while for a specimen having lesser roughness, the optimal beam aperture angle $\alpha_i$ given by the expression (6) or (7) is set in association with the accelerating voltage. In this manner, the electron optical system can easily be realized optimally for the specimens of any surface roughness states. The beam aperture angle $\alpha_i$ as set is displayed on the CRT 116 (FIG. 1).

As will be appreciated from the foregoing description, the advantageous effects mentioned below can be attained according to the present invention.

(1) Since the aperture plate is installed between the accelerating electrode and the condenser lens where a high vacuum is maintained, the aperture plate can satisfactorily be protected against contamination due to illumination of the electron beam.

(2) Since the beam aperture angle can be maintained at an arbitrary value independent of changes in the accelerating voltage and the probe current, the electron optical system can always be maintained in the optimal state.

While the invention has been described in terms of its preferred embodiments, it should be understood that numerous modifications may be made thereto without departing from the spirit and scope of the invention. It is intended that all such modifications fall within the scope of the invention.

I claim:

1. A field emission scanning electron microscope, comprising:

a field emission electron gun including at least a cathode, an extracting electrode for extracting an electron beam from said cathode and an accelerating electrode for accelerating said electron beam;

an electron lens assembly including at least a condenser lens for converging the electron beam emitted from said field emission electron gun and an objective lens for focusing the electron beam converged by said condenser lens onto a specimen;

a beam limiting aperture plate installed between said accelerating electrode and said electron lens assembly;

scanning means for scanning said specimen with said electron beam focused on said specimen;

detecting means for detecting an information signal characterizing said specimen and emitted therefrom; and display means for displaying an image of a region of said specimen scanned with said focused electron beam.

2. A field emission scanning electron microscope according to claim 1, further comprising means for setting the current strength of the electron beam to a desired value only by controlling an extracting voltage applied said extracting electrode.

3. A field emission scanning electron microscope according to claim 1, wherein said condenser lens projects said electron beam onto said objective lens in a substantially collimated state.

4. A field emission scanning electron microscope comprising:

a field emission electron gun including at least a cathode, an extracting electrode for extracting an electron beam from said cathode and an accelerating electrode for accelerating said electron beam;

an electron lens assembly including at least a condenser lens for converging the electron beam emitted from said field emission electron gun and an objective lens for focusing the electron beam converged by said condenser lens onto a specimen;

an aperture plate installed closer to said field emission electron gun that to said electron lens assembly;

scanning means for scanning said specimen with said electron beam focused on said specimen;

detecting means for detecting an information signal characterizing said specimen and emitted therefrom;

display means for displaying an image of a region of said specimen scanned with said focused electron beam;

means for detecting a virtual electron source position on the basis of an extracting voltage and an accelerating voltage;

means for setting an optimal aperture angle of beam;

condenser lens control means for controlling the focal length of said condenser lens so that said electron beam has a constant spread on the principal plane of said objective lens independent of the virtual electron source position; and objective lens control means for controlling the focal length of said objective lens in accordance with change in the focal length of said condenser lens so that said beam aperture angle is maintained to be constant.

5. A field emission scanning electron microscope according to claim 4, wherein said optimal beam aperture angle setting means determines the optimal beam aperture angle ($\alpha_i$) in such manner that when $$V_0 \leqq 1.71 \times 10^4 \times C_s^{-\frac{1}{2}} \times C_c^{4/3} \times C_c^{4/3} \times \Delta I^{4/3},$$

then $$\alpha_i = 1.1 \times \{(\lambda/C_c) \times (V_0/\Delta V)\}^{\frac{1}{2}}, \text{ and}$$

when $$V_0 > 1.71 \times 10^4 \times C_s^{-\frac{3}{8}} \times C_c^{4/3} \times \Delta V^{4/3},$$

then $$\alpha_i = (4\lambda/C_s)^{\frac{1}{4}},$$

where $V_0$ represents the accelerating voltage, $C_c$ represents chromatic aberration coefficient of said objective lens, $C_s$ represents spherical aberration coefficient of said objective lens, $\Delta V$ represents a width of energy range of said electron beam, and $\lambda$ represents the de Broglie wavelength.

6. A field emission scanning electron microscope according to claim 5, wherein said condenser lens control means for controlling the focal length of said condenser lens controls a distance ($L_c$) between said condenser lens and the focal point thereof in accordance with the following expression:

$$L_c = \{L_2(S+L_1)R_a\} / \{L_1(S+L_a)\alpha_i + (S+L_1)R_a\} \quad (1)$$

where
- $\alpha_i$ represents the optimal beam aperture angle,
- S represents a distance between the cathode and the virtual electron source position,
- $L_a$ represents a distance between the cathode and the aperture plate,
- $L_1$ represents a distance between the cathode and the principal plane of the condenser lens,
- $L_2$ represents a distance between the principal plane of the condenser lens and that of the objective lens,
- $L_i$ represents a distance between the principal plane of the objective lens and a surface of the specimen,
- $R_a$ represents a radius of a hole formed in the aperture plate.

7. A field emission scanning electron microscope according to claim 5, wherein said condenser lens control means for controlling the focal length of said condenser lens controls a distance ($L_c$) between said condenser lens and a virtual focal point thereof in accordance with the following expression:

$$L_c = R_a(L_1+S)L_2/L_1(L_a+S)\alpha_i - R_a(L_1+S) \quad (2)$$

where
- $\alpha_i$ represents the optimal beam aperture angle,
- S represents a distance between the cathode and the virtual electron source position,
- $L_a$ represents a distance between the cathode and the aperture plate,
- $L_1$ represents a distance between the cathode and the principal plane of the condenser lens,
- $L_2$ represents a distance between the principal plane of the condenser lens and that of the objective lens,
- $L_i$ represents a distance between the principal plane of the objective lens and a surface of the specimen,
- $R_a$ represents a radius of a hole formed in the aperture plate.

8. A field emission scanning electron microscope according to claim 7, further comprising means for displaying the beam aperture angle ($\alpha_i$).

9. A field emission scanning electron microscope comprising:

a field emission electron gun including at least a cathode, an extracting electrode for extracting an electron beam from said cathode and an accelerating electrode for accelerating said electron beam;

an electron lens assembly including at least a condenser lens for converging the electron beam emitted from said field emission electron gun and an objective lens for focusing the electron beam converged by said condenser lens onto a specimen;

an aperture plate installed closer to said field emission electron gun than to said electron lens assembly;

scanning means for scanning said specimen with said electron beam focused on said specimen;

detecting means for detecting an information signal characterizing said specimen and emitted therefrom;

display means for displaying an image of a region of said specimen scanned with said focused electron beam; and means for displaying the beam aperture angle ($\alpha_i$).

10. A method of controlling an aperture angle of an illuminating electron beam at a specimen in a field emission scanning electron microscope, comprising:

a step of emitting the electron beam from a field emission electron gun including at least a cathode, an extracting electrode for extracting the electron beam from said cathode and an accelerating electrode for accelerating said electron beam;

a step of detecting a virtual electron source position on the basis of an extracting voltage and an accelerating voltage;

a step of setting an optimal aperture angle of beam;

a step of for controlling the focal length of said condenser lens so that said electron beam has a constant spread on the principal plane of said objective lens independent of the virtual electron source position; and a step of focusing said electron beam onto a specimen with a constant aperture angle of the beam corresponding to the spread of said electron beam at the principal plane of said objective lens.

11. A control method according to claim 10, wherein at said optimal beam aperture angle setting step, the optimal beam aperture angle ($\alpha_i$) is determined in such manner that when $$V_0 \leq 1.71 \times 10^4 \times C_s^{-\frac{3}{8}} \times C_c^{4/3} \times \Delta V^{4/3},$$

then $$\alpha_i = 1.1 \times \{(\lambda/C_c) \times (V_0/\Delta V)\}^{\frac{1}{2}}, \text{ and}$$

when $$V_0 > 1.71 \times 10^4 \times C_x^{-\frac{3}{8}} \times C_c^{4/3} \times \Delta V^{4/3},$$

then
$$\alpha_i = (4\lambda/C_s)^{\frac{1}{4}},$$

where $V_0$ represents the accelerating voltage, $C_c$ represents a chromatic aberration coefficient of said objective lens, $C_s$ represents a spherical aberration coefficient of said objective lens, $\Delta V$ represents a width of energy range of said electron beam, and $\lambda$ represents the de Broglie wavelength.

12. A control method according to claim 11, wherein at said step of controlling the focal length of said condenser lens, a distance ($L_c$) between said condenser lens and the focal point thereof is controlled in accordance with the following expression:

$$L_c = \{L_2(S+L_1)R_a(\}L_i(S+L_a)\alpha_i + (S+L_1)R_a\} \quad (1)$$

where
- $\alpha_i$ represents the optimal beam aperture angle,
- S represents a distance between the cathode and the virtual electron source position,
- $L_a$ represents a distance between the cathode and the aperture plate,
- $L_1$ represents a distance between the cathode and the principal plane of the condenser lens,
- $L_2$ represents a distance between the principal plane of the condenser lens and that of the objective lens,
- $L_i$ represents a distance between the principal plane of the objective lens and a surface of the specimen,
- $R_a$ represents a radius of a hole formed in the aperture plate.

13. A control method according to claim 12, further comprising a step of constricting the diameter of said electron beam emitted through field emission by means of an aperture plate before said beam is incident on said condenser lens.

14. A method of controlling an aperture angle of an illuminating electron beam at a specimen in a field emission scanning electron microscope, comprising:
   - a step of emitting the electron beam from a field emission electron gun including at least a cathode, an extracting electrode for extracting the electron beam from said cathode and an accelerating electrode for accelerating said electron beam;
   - a step of constricting the diameter of said electron beam emitted through field emission by means of an aperture plate before said beam is incident on said condenser lens;
   - a step of detecting a virtual electron source position on the basis of an extracting voltage and an accelerating voltage;
   - a step of setting an optimal aperture angle of the electron beam;
   - a step of for controlling the focal length of said condenser lens so that said electron beam has a constant spread on the principal plane of said objective lens independent of the virtual electron source position; and
   - a step of focusing said electron beam onto a specimen with a constant aperture angle of the beam corresponding to the spread of said electron beam at the principal plane of said objective lens.

15. A control method according to claim 14, wherein at said optimal beam aperture angle setting step, the optimal beam aperture angle ($\alpha_i$) is determined in such a manner that when $$V_0 \leq 1.71 \times 10^4 \times C_s^{-1} \times C_c^{4/3} \times \Delta V^{4/3},$$

then $$\alpha_i = 1.1 \times \{(\lambda/C_c) \times (V_0/\Delta V)\}^{\frac{1}{2}}, \text{ and}$$

when $$V_0 > 1.71 \times 10^4 \times C_s^{-1} \times C_c^{4/3} \times \Delta V^{4/3},$$

then $$\alpha_i = (4\lambda/C_s)^{\frac{1}{4}}.$$

where $V_0$ represents the accelerating voltage, $C_c$ represents a chromatic aberration coefficient of said objective lens, $C_s$ represents a spherical aberration coefficient of said objective lens, $\Delta V$ represents a width of energy range of said electron beam, and $\lambda$ represents the de Broglie wavelength.

16. A control method according to claim 15, wherein at said step of controlling the focal length of said condenser lens, a distance ($L_c$) between said condenser lens and a virtual focal point thereof is controlled in accordance with the following expression:

$$L_c = R_a(L_1+S)L_2/L_i(L_a+S)\alpha_i - R_a(L_1+S) \quad (2)$$

where
- $\alpha_i$ represents the optimal beam aperture angle,
- S represents a distance between the cathode and the virtual electron source position,
- $L_a$ represents a distance between the cathode and the aperture plate,
- $L_1$ represents a distance between the cathode and the principal plane of the condenser lens,
- $L_2$ represents a distance between the principal plane of the condenser lens and that of the objective lens,
- $L_i$ represents a distance between the principal plane of the objective lens and a surface of the specimen,
- $R_a$ represents a radius of a hole formed in the aperture plate.

17. A control method according to claim 14, wherein said condenser lens projects said electron beam onto said objective lens in a substantially collimated state.

* * * * *